US008659738B2

(12) United States Patent
Kashima

(10) Patent No.: US 8,659,738 B2
(45) Date of Patent: Feb. 25, 2014

(54) PHASE DIFFERENCE LAYER LAMINATED BODY FOR THREE DIMENSIONAL LIQUID CRYSTAL DISPLAY DEVICE AND MANUFACTURING METHOD THEREOF

(71) Applicant: Dai Nippon Printing Co., Ltd., Tokyo (JP)

(72) Inventor: Keiji Kashima, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 13/728,160

(22) Filed: Dec. 27, 2012

(65) Prior Publication Data
US 2013/0137046 A1    May 30, 2013

Related U.S. Application Data

(60) Division of application No. 12/923,312, filed on Sep. 14, 2010, and a continuation-in-part of application No. 12/073,636, filed on Mar. 7, 2008, now abandoned, and a continuation of application No. 11/602,382, filed on Nov. 21, 2006, now Pat. No. 7,411,645, and a continuation of application No. 10/473,215, filed as application No. PCT/JP02/11601 on Nov. 7, 2002, now abandoned.

(30) Foreign Application Priority Data

Nov. 8, 2001  (JP) .................................. 2001-343873
Sep. 4, 2002  (JP) .................................. 2002-259150

(51) Int. Cl.
*G02F 1/1335*  (2006.01)
*G02F 1/1337*  (2006.01)

(52) U.S. Cl.
USPC ............ 349/187; 349/117; 349/124; 349/129

(58) Field of Classification Search
USPC .......................................... 349/124, 129, 117
See application file for complete search history.

(56) References Cited

U.S. PATENT DOCUMENTS 5,559,617 A    9/1996  Mitsui et al.
5,589,963 A    12/1996 Gunning, III et al.
(Continued)

FOREIGN PATENT DOCUMENTS

DE    196 14 210 A1   10/1996
EP    0 525 478 A2    2/1993
(Continued)

OTHER PUBLICATIONS

Schadt, et al., "Surface-induced parallel alignment of liquid crystals by linearly polymerized photopolymers," Japanese Journal of Applied Physics, Jul. 1992, pp. 2155-2164, vol. 31, No. 7, Tokyo, Japan.

(Continued)

*Primary Examiner* — Michael Caley
(74) *Attorney, Agent, or Firm* — Oliff & Berridge, PLC

(57) ABSTRACT

A phase difference layer laminated body used in a three-dimensional liquid crystal display device, wherein unit cells are divided into groups for left and right eyes, which are given different degrees of polarization, thereby creating a three-dimensional image, further wherein the phase difference layer laminated body has a base material having orientability, and a phase difference layer made of a liquid crystal material that can form a nematic phase and formed in a pattern with two different portions, and the liquid crystal material in each of two different portions is oriented to have different refractive index anisotropy each other that conforms to the two different degrees of polarization and fixed as it is.

2 Claims, 10 Drawing Sheets

(56) References Cited

U.S. PATENT DOCUMENTS

| | | | |
|---|---|---|---|
| 5,601,884 | A | 2/1997 | Ohnishi et al. |
| 5,631,051 | A | 5/1997 | Ito et al. |
| 5,903,330 | A | 5/1999 | Funfschilling et al. |
| 5,926,241 | A | 7/1999 | Gunning, III |
| 5,929,946 | A * | 7/1999 | Sharp et al. .............. 349/18 |
| 5,953,091 | A | 9/1999 | Jones et al. |
| 6,034,755 | A | 3/2000 | Watanabe |
| 6,046,787 | A | 4/2000 | Nishiguchi |
| 6,055,103 | A | 4/2000 | Woodgate et al. |
| 6,067,138 | A | 5/2000 | Nishiguchi et al. |
| 6,067,141 | A | 5/2000 | Yamada et al. |
| 6,128,059 | A | 10/2000 | Nishiguchi |
| 6,222,672 | B1 | 4/2001 | Towler et al. |
| 6,226,063 | B1 | 5/2001 | Hsieh et al. |
| 6,356,324 | B1 | 3/2002 | Nishiguchi et al. |
| 6,567,144 | B1 | 5/2003 | Kim et al. |
| 6,624,863 | B1 | 9/2003 | Jacobs et al. |
| 6,735,017 | B1 | 5/2004 | Acosta et al. |
| 7,411,645 | B2 | 8/2008 | Kashima |
| 2009/0040401 | A1 | 2/2009 | Tamura et al. |

FOREIGN PATENT DOCUMENTS

| | | |
|---|---|---|
| EP | 0 632 311 A1 | 1/1995 |
| EP | 0 656 560 A2 | 6/1995 |
| EP | 656 560 A2 | 6/1995 |
| EP | 0 738 906 A2 | 10/1996 |
| EP | 0 772 069 A1 | 5/1997 |
| EP | 0 887 667 A2 | 12/1998 |
| EP | 0 949 533 A2 | 10/1999 |
| GB | 2 324 881 A | 11/1998 |
| GB | 2 337 843 A | 12/1999 |
| JP | A-02-074924 | 3/1990 |
| JP | A-08-234205 | 9/1996 |
| JP | A-08-292432 | 11/1996 |
| JP | A-09-054212 | 2/1997 |
| JP | A-09-068699 | 3/1997 |
| JP | A-09-304740 | 11/1997 |
| JP | A-10-227998 | 8/1998 |
| JP | A-10-253824 | 9/1998 |
| JP | A 11-242225 | 9/1999 |
| JP | A-11-352487 | 12/1999 |
| JP | A-11-352492 | 12/1999 |
| JP | A-2001-188125 | 7/2001 |
| JP | A-2001-249225 | 9/2001 |
| KR | 10-0206445 B1 | 7/1999 |
| WO | WO 2009/123021 A1 | 10/2009 |

OTHER PUBLICATIONS

Sieberle, et al., "Photo-aligned anisotropic optical thin films," Journal of the Society for Information Display, Jan. 2004, pp. 87-92, vol. 12, US.

Oct. 24, 2011 Search Report issued in European Application No. 10012826.3.

Chen, J. et al. "Simple Multimode Stereoscopic Liquid Crystal Display." Japanese Journal of Applied Physics, Japan Society of Applied Physics, JP vol. 36, No. 12B, pp. L1685-L1688. Dec. 15, 1997.

Okada, H. et al. "Possibility of Stereoscopic Displays by Using a Viewing Angle Dependence of Twisted Nematic Liquid Crystal Cells." IEEE Transactions on Electron Devices, IEEE Service Center, Pisacataway, NJ, US, vol. 45, No. 7, pp. 1445-1452. Jul. 7, 1998.

Chen, J. et al. "Simple four-domain twisted nematic liquid crystal display." Applied Physics Letters, AIP, American Institute of Physics, Melville, NY, US, vol. 67, No. 14, pp. 1990-1992. Oct. 2, 1995.

Travis "The Display of Three-Dimensional Video Images." Proceedings of the IEEE, IEEE. New York, US, vol. 85, No. 11, pp. 1817-1832. Nov. 11, 1997.

European Search Report issued in EP Application No. 10012826.3 on Jun. 16, 2011.

Aoyama et al., "Alignment of Liquid Crystals on the Stretched Polymer Films," 72 Mol. Cryst. Liq. Cryst 127-132 (1981).

Geary et al., "The mechanism of polymer alignment of liquid-crystal materials," 62 J. Appl. Phys. 10 (Nov. 15, 1987).

H. Aoyama et al.; "Alignment of Liquid Crystals on the Stretched Polymer Films;" *Mol. Cryst. Liq. Cryst.*; vol. 72 (Letters); 1981; pp. 127-132; XP000676485.

European Search Report issued in European Patent Application No. 08008186.2; Dec. 15, 2009.

Apr. 25, 2013 Office Action issued in U.S. Appl. No. 13/728,183.

Oct. 3, 2013 Office Action issued in U.S. Appl. No. 13/954,483.

U.S. Office Action issued in U.S. Appl. No. 12/923,312, dated Dec. 17, 2013.

* cited by examiner

PHASE DIFFERENCE LAYER LAMINATED BODY FOR THREE DIMENSIONAL LIQUID CRYSTAL DISPLAY DEVICE AND MANUFACTURING METHOD THEREOF

This application is a Divisional of Ser. No. 12/923,312, filed Sep. 14, 2010, which in turn is a Continuation-in-Part of Ser. No. 12/073,636, filed Mar. 7, 2008, which in turn is a Continuation of Ser. No. 11/602,382, filed Nov. 21, 2006, which in turn is a Continuation of Ser. No. 10/473,215, filed Oct. 30, 2003, which in turn is a National Phase of International Patent Application No. PCT/JP02/11601, filed Nov. 7, 2002, which claims priority of Japanese Patent Application Nos. 2001-343873, filed Nov. 8, 2001 and 2002-259150, filed Sep. 4, 2002. The disclosures of these applications are incorporated herein by reference in their entirety.

TECHNICAL FIELD

The present invention relates to a phase difference layer laminated body for a three dimensional liquid crystal display device which offers high orientation freedom and allows easy patterning, a manufacturing method thereof, a manufacturing method of an optical oriented film used for a phase difference layer laminated body, a liquid crystal cell including a phase difference layer laminated body and a three dimensional liquid crystal display device.

BACKGROUND ART

Phase difference film used for liquid crystal displays and the like is conventionally made of a polymer film which is stretched in certain directions to orient the main chains of the polymer in these directions so that the polymer film exhibits refractive index anisotropy.

According to this method, the polymer film can be provided with refractive index anisotropy with relative ease; the method was excellent in that it enabled easy formation of phase difference films.

However, this method only allows fabrication of phase difference films in which the main chains of polymer are oriented in the directions of stretch, and therefore the problem was that the orientation of resultant phase difference films was limited only to directions parallel to the surface of the phase difference film.

Meanwhile, phase difference films having vertical polymer orientation relative to the surface, or various other orientation directions, are now in demand; the problem with the above method for obtaining phase difference films by stretching polymer films is that it cannot meet such demand because of its little freedom in setting orientation direction.

In a multi-domain type liquid crystal display element, for example, in which each unit cell is divided into a plurality of regions with different directions of liquid crystal directors, optical compensation with the conventional phase difference film was, while favorable in some regions, not necessarily satisfactory in other regions.

DISCLOSURE OF THE INVENTION

The present invention has been devised in view of the above problems, and a main object thereof is to provide a phase difference layer laminated body which has very high freedom of molecular orientation in its phase difference layer and which can be manufactured with ease, a manufacturing method thereof, and a liquid crystal display device.

To achieve the above object, the present invention provides (1), a phase difference layer laminated body used in a three-dimensional liquid crystal display device, wherein unit cells are divided into groups for left and right eyes, which are given different degrees of polarization, thereby creating a three-dimensional image, further wherein the phase difference layer laminated body has a base material having orientability, and a phase difference layer made of a liquid crystal material that can form a nematic phase and formed in a pattern with two different portions, and the liquid crystal material in each of two different portions is oriented to have different refractive index anisotropy each other that conforms to the two different degrees of polarization and fixed as it is. According to the invention, since a liquid crystal material that can form a nematic phase is used for the phase difference layer, by suitably selecting the type of liquid crystal material and the base material having orientability, it is possible to determine orientation directions with ease, and therefore the phase difference layer laminated body thus obtained can be applied to a three dimensional liquid crystal device.

Furthermore, the present invention provides (7), a method for manufacturing a phase difference layer laminated body used in a three-dimensional liquid crystal display device, wherein unit cells are divided into groups for left and right eyes, which are given different degrees of polarization, thereby creating a three-dimensional image, characterized by having:

a base material preparation step of preparing a base material;

an application step of applying a refractive index anisotropic material having an ability of providing refractive index anisotropy on the base material for forming a refractive index anisotropic material layer;

an orientation processing step of performing orientation processing to the refractive index anisotropic material layer so as to form a pattern with two portions oriented in two different directions;

an orientation fixing step of fixing the orientation of the refractive index anisotropic material layer that has undergone the orientation processing in the orientation processing step.

BRIEF DESCRIPTION OF THE DRAWINGS

FIG. 4 is a schematic plan view of an oriented film with patterned orientation directions;

BEST MODE FOR CARRYING OUT THE INVENTION

The phase difference layer laminated body, and the manufacturing method thereof, according to the invention, will be hereinafter described respectively.

A. Phase Difference Layer Laminated Body

The phase difference layer laminated body of the invention is characterized by having a base material having orientability, and a phase difference layer made of a liquid crystal material that can form a nematic phase and formed on the base material such as to have refractive index anisotropy.

With such a construction of the phase difference layer laminated body of the invention, if the orientability of the base material is such that it can orient liquid crystal at a preset angle relative to the phase difference layer surface, and a phase difference layer laminated body is formed with the use of liquid crystal material that is orientable in such a manner, a phase difference layer oriented at a preset angle to the surface can readily be provided. A phase difference layer laminated body having such a phase difference layer will find new applications in addition to the conventional ones.

Figure 1:
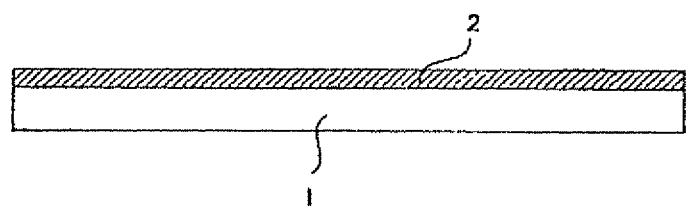
FIG. 1 is a schematic cross-sectional view showing one example of a phase difference layer laminated body of the invention.

This phase difference layer laminated body will further be described below with reference to the drawings. FIG. 1 shows one example of a phase difference layer laminated body of the invention, in a state in which a phase difference layer 2 of liquid crystal material that can form a nematic phase is formed on a base material 1 having surface orientability such that the liquid crystal has refractive index anisotropy.

Figure 2:
FIG. 2 is a schematic cross-sectional view showing another example of a phase difference layer laminated body of the invention.

The invention includes another construction such as the one shown in FIG. 2 wherein the base material 1 having the above orientability is constituted by a transparent substrate 3 and an oriented film 4 formed thereon. The use of such an oriented film 4 will make the orientation freedom of the phase difference layer 2 extremely high as will be described later, which in turn enhances the orientation freedom of the phase difference layer laminated body to a very high degree.

Figure 3:
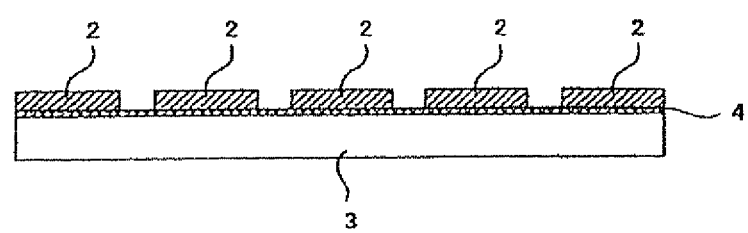
FIG. 3 is a schematic cross-sectional view showing yet another example of a phase difference layer laminated body of the invention.

Also, in the present invention, the phase difference layer formed on the orientated film 4 may have a certain pattern as shown in FIG. 3. A three-dimensional display device or the like, for example, which enables display of three-dimensional images by differing the polarization for the left and right eyes, requires a phase difference layer laminated body having a patterned phase difference layer; the phase difference layer laminated body shown in FIG. 3 can be used in such a three-dimensional display device or the like.

Various elements of the phase difference layer laminated body of the invention are described below in more detail.

1. Phase Difference Layer

The phase difference layer laminated body of the invention is characterized in that a phase difference layer 2 of a liquid crystal material that can form a nematic phase is formed on a base material 1 having orientability such that the liquid crystal has refractive index anisotropy, as shown in FIG. 1.

(Liquid Crystal Material)

For the material forming the phase difference layer, a liquid crystal material is used as noted above. The term "liquid crystal material" in this invention refers to a material that can transform into a liquid crystal phase at a certain temperature; more particularly, this invention is characterized in that this liquid crystal phase of the material is a nematic phase.

In the present invention, as will be described in more detail later under the section of "manufacturing method of a phase difference layer laminated body," a liquid crystal material is transformed into a liquid crystal phase upon a base material having orientability, whereby the liquid crystal molecules in the phase difference layer are oriented to exhibit refractive index anisotropy. Therefore, the upper limit of the above-mentioned temperature should not be limited to a specific value and may be set such that no damage is inflicted on the base material, or, in the case of an oriented film formed on a transparent substrate as will be described later, on the transparent substrate and oriented film. More specifically, a liquid crystal material that transforms into a liquid crystal phase at a temperature of 120.degree. C. or lower, more preferably 100.degree. C. or lower, can favorably be used in respect of easy control of processing temperature and maintenance of dimensional precision.

The lower limit, on the other hand, of the temperature at which the liquid crystal phase forms, should be set so that the liquid crystal material can maintain its orientation, subject to the temperature range for the application as a phase difference layer laminated body.

Here, a liquid crystal material in an application as a phase difference layer laminated body can take two different states: In this invention, both a non-polymerizable polymer liquid crystal material and a polymerizable liquid crystal material can be used as will be described later. In the case of a polymerizable liquid crystal material, when forming the phase difference layer, as will be described in more detail under the section of "manufacturing method of phase difference layer laminated body," polymerization is achieved by irradiating the material with the activating radiation beam. In this case, therefore, the liquid crystal material used in the phase difference layer laminated body has already been polymerized, its orientation being fixed. Namely, in the case of the polymerizable liquid crystal material, there is no limitation on the lower limit of the temperature at which the material transforms into a liquid crystal phase.

On the other hand, in the case of the non-polymerizable polymer liquid crystal material, the liquid crystal phase is in the glass state when used as the phase difference layer laminated body. That is, if it transforms into an isotropic state due to a rise in temperature during storage or use, its orientation will be in disorder and the phase difference layer can no longer be put in use. Thus, in the case of using a non-polymerizable polymer liquid crystal material in the invention, it is preferred that the material transform into an isotropic phase at temperatures equal to or more than a preset value. The lower limit of the temperature at which the material transforms into an isotropic phase in this case depends on the purposes of use, but generally speaking, it is at least 80.degree. C., or more preferably, 100.degree. C. or more.

The liquid crystal material that can form a nematic phase used in this invention can either be a polymerizable liquid crystal material and non-polymerizable polymer liquid crystal material as noted above.

For the polymerizable liquid crystal material, any of polymerizable liquid crystal monomer, polymerizable liquid crystal oligomer, and polymerizable liquid crystal polymer may be used. For the non-polymerizable polymer liquid crystal material, on the other hand, because of the above-mentioned requirement for the maintenance of orientation under various temperatures during storage or use of the phase difference layer laminated body, a liquid crystal material having a relatively high isotropic transition temperature should preferably be used.

In this invention, particularly, a polymerizable liquid crystal material is most preferably used. This is because the use of polymerizable liquid crystal material, whose orientation can be fixed by polymerization that is achieved by irradiating the material with the activating radiation beam as will be described later, enables easy orientation of the liquid crystal at low temperatures, and also because it can be used without temperature limitations or other restrictions due to the fixed orientation when put in use.

More particularly, a polymerizable liquid crystal monomer is preferably used in this invention. This is because a polymerizable liquid crystal monomer lets itself to be oriented at a lower temperature than other polymerizable liquid crystal materials such as polymerizable liquid crystal oligomers or polymers; it also has high orientation sensitivity, allowing the orientation to be readily achieved.

As one example of the polymerizable liquid crystal material, the compounds included in the general formula 1 below or a mixture of two or more of the following compounds may be used. In the case of liquid crystal monomers expressed by the general chemical formula 1, X is preferably an integer of 2 to 5.

In addition, polymerizable liquid crystal oligomers or polymers can also be used in this invention. Any one of known polymerizable liquid crystal oligomers or polymers may suitably be selected and used.

Furthermore, photopolymerization initiators may be used as required in this invention. Photopolymerization initiator may not always be necessary as with the case with, for example, polymerization of polymerizable liquid crystal material by irradiation of electron beams, but it is normally used for the promotion of polymerization in the commonly used method of curing by irradiation of, e.g., ultraviolet rays.

Also, a sensitizing agent may be added in addition to the photopolymerization initiator, in an amount that does not inhibit achievement of the object of the invention.

Photopolymerization initiator is generally added in a range of 0.01 to 20% by weight; preferably, it is added in a range of 0.1 to 10% by weight, and more preferably 0.5 to 5% by weight, to the polymerizable liquid crystal material of the invention.

On the other hand, non-polymerizable liquid crystal materials can also be used in this invention, as noted above. Any such liquid crystal material can be used as long as it satisfies the requirement that the orientation of liquid crystal does not change during the use or storage thereof as a phase difference layer laminated body as described above; generally, however, polymer material is preferable in terms of the temperatures at which the polymer material transforms into a liquid phase or a liquid crystal phase. Any commonly used liquid crystal material that can form a nematic phase in a liquid crystal phase can be used, including both main-chain and side-chain liquid crystal polymers.

More specifically, typical examples of main-chain liquid crystal polymers are polymers such as polyesters, polyamides, polycarbonates, and polyesteramides.

Further, examples of side-chain liquid crystal polymers are those that have a backbone structure such as polyacrylate, polymethacrylate, polysiloxane, and polymalonate and a low molecular weight liquid crystal compound (mesogen group) comprising a para-substituted cyclic compound or the like as a side chain, with or without a spacer comprising conjugated atoms.

(Refractive Index Anisotropy)

In this invention, the above-mentioned material must be formed into a phase difference layer having refractive index anisotropy. Refractive index anisotropy differs depending on the liquid crystal material being used and the orientability of the base material surface, but the following can generally be said The difference $\Delta n$, expressed as $\Delta n = |n_x - n_y|$, between the indexes of refraction $n_x$ and $n_y$ in an X axis and Y axis on a plane parallel to the orientation of the polymer, the X-axis being orthogonal and Y-axis being parallel to the orientation direction, should preferably be 0.05 or more, or more preferably 0.1 or more. A phase difference layer having less refractive index anisotropy than that may present a problem in regard to thickness or the like in actual applications.

(Patterned Phase Difference Layer)

In this invention, the phase difference layer formed of the above-mentioned liquid crystal material may have a certain pattern.

A phase difference layer laminated body having a patterned phase difference layer is preferably used in, for example, a three-dimensional liquid crystal display device or the like, wherein unit cells are divided into groups for left and right eyes, which are given different degrees of polarization, thereby creating a three-dimensional image. Such a patterned phase difference layer laminated body was conventionally made by manual cutting and bonding of phase difference layer films comprising common stretched films. Such technique was problematic in terms of cost and had limitations on the formation of highly precise patterns.

The present invention overcomes this problem and provides a phase difference layer laminated body in which a phase difference layer is formed on the base material in a highly precise pattern.

In this invention, the pattern formation method differs depending on the type of liquid crystal material. That is, the pattern formation method for a polymerizable liquid crystal material is different from that for a normal liquid crystal material.

The pattern formation method will be described later in more detail under the section "manufacturing method of a phase difference layer laminated body;" in short, in the case of the polymerizable liquid crystal material, the irradiation of activating radiation beam for the fixing of the orientation of liquid crystal material is made in a certain pattern, and after the polymerization, uncured portions of liquid crystal material are removed by a solvent; patterning of the phase difference layer is thus readily achieved.

In this invention, amongst the polymerizable liquid crystal materials mentioned above, a polymerizable liquid crystal monomer is preferably used because of the ease of the patterning. With a polymerizable liquid crystal monomer, development is easy, the pattern is more clear-cut, and formation of more precise pattern is possible.

On the other hand, a photolithography technique using a photoresist, or a method of applying a normal liquid crystal material in a certain pattern by a nozzle discharge or printing technique may be adopted for the pattern formation method in the case of using a non-polymerizable polymer liquid crystal material.

In the case of forming the phase difference layer laminated body in a pattern, the pattern may be any pattern, for example, striped or zigzagged.

2. Base Material Having Orientability

The phase difference layer laminated body of the invention is comprised of a base material 1 having orientability, on which is formed the above-described phase difference layer 2, as shown in FIG. 1.

For the base material having orientability, there are two cases: One is that the base material 1 itself has orientability, as shown in FIG. 1, and the other is that an oriented film 4 is formed on a transparent substrate 3 as shown in FIG. 2 so that they together function as a base material 1 having orientability. The followings are descriptions of these cases as the first and second embodiments.

a. FIRST EMBODIMENT

In this embodiment, the base material itself has orientability; specifically, the base material is a stretched film. With a stretched film, the liquid crystal material can be oriented along a stretched direction of the film. Therefore, the processing of the base material is accomplished simply by preparation of a stretched film, which is a merit that the processing step is made very simple. For the stretched film, any commercially available stretched film can be used, or a stretched film can be made, according to needs, of various materials.

More specifically, examples of the film include films made of thermoplastic polymers, such as polycarbonate polymers, polyester polymers such as polyarylate or polyethylene terephthalate, polyimide polymers, polysulfone polymers, polyethersulfone polymers, polystyrene polymers, polyolefin polymers such as polyethylene or polypropylene, polyvinyl alcohol polymers, cellulose acetate polymers, polyvinyl chloride polymers, and polymethylmethacrylate polymers, and films made of liquid crystal polymers.

In this invention, particularly, polyethylene terephthalate (PET) film is preferably used, because it has a wide range of stretch ratio and is readily available.

The stretch ratio of the stretched film used in this invention is not limited to a particular value, as long as the film exhibits orientability. Thus, even a biaxially stretched film can be used, if the stretch ratio differs between the two axes.

The stretch ratio differs largely depending on the material used, and there are no particular limits to the stretch ratio. Generally, materials having a 150 to 300% stretch ratio can be used; a preferable range is 200 to 250%.

b. SECOND EMBODIMENT

In the second embodiment, the base material having the above orientability comprises a transparent substrate and an oriented film formed thereon.

With this embodiment, there is a merit that selection of the orientated film enables selection of orientation in a relatively wider range of directions. Selecting the type of liquid applied on the transparent substrate for forming the oriented film allows orientation in various directions and enables even more effective orientation.

An oriented film commonly used for a liquid crystal display device or the like can favorably be used for the oriented film of this embodiment; generally, an oriented film of polyimide that has undergone rubbing treatment is favorably used.

For the transparent substrate used in this embodiment, any transparent material can be used, e.g., a transparent and rigid material having no flexibility such as silica glass, Pyrex (registered trademark) glass, and synthetic silica glass, or a transparent and flexible material such as a transparent resin film, and optical resin sheet or the like.

(Patterning of Orientation on the Oriented Film Surface)

In this embodiment, the above oriented film may have a certain pattern on the surface thereof. That is, the oriented film may have a pattern with different directions of orientation, including portions oriented in, at least two, different directions.

Figure 4:
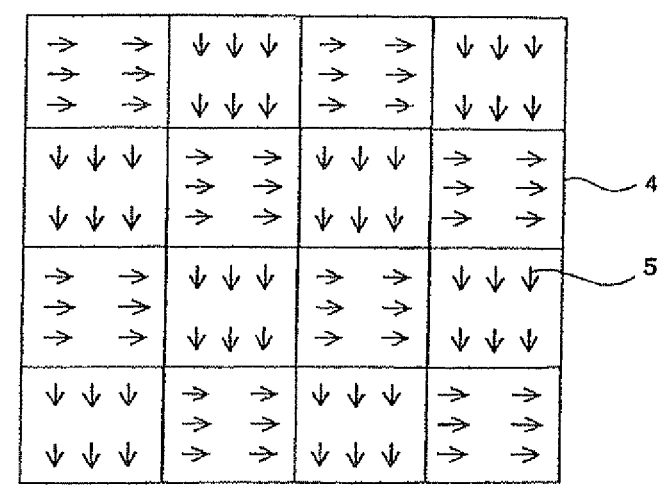

FIG. 4 is a model view showing an oriented film 4 formed with a pattern of different directions of orientation. Arrows 5 in the drawing indicate the directions of orientation. FIG. 4 shows one example in which the oriented film has a checked pattern, but various other patterns e.g., a striped pattern and the like, may be employed in accordance with the purposes of use in this invention.

By thus forming a pattern on the oriented film surface with different directions of orientation, the phase difference layer comprising a liquid crystal material having refractive index anisotropy provided thereon can have a pattern of refractive index anisotropy conforming to the pattern on the oriented film surface. As a result, a phase difference layer laminated body having portions with different phase differences in a certain pattern can be obtained, which can be used in various applications. Patterning on the oriented film surface may be achieved by a rubbing technique using a mask, or in the case of using a film oriented with the irradiation of light beams, by a mask exposure technique or the like.

3. Others

In addition, the phase difference layer laminated body of the invention can be formed with other functional layers such as a protective layer or the like in accordance with the purposes for which the optical element is to be used.

If the phase difference layer laminated body of the invention is used as a .lamda./4 phase difference layer, it can be used as a circular polarization plate by bonding a polarization plate thereto with an adhesive layer interposed therebetween.

Figure 6:
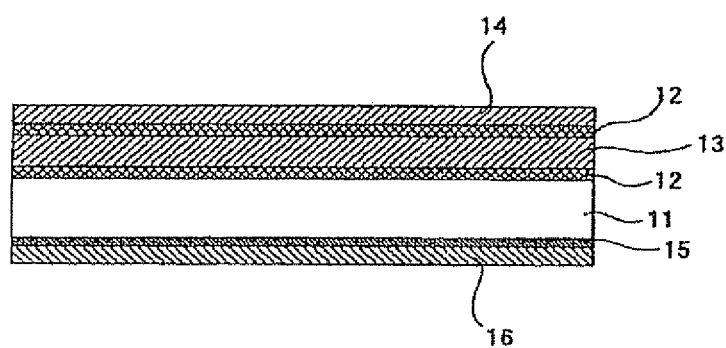
FIG. 6 is a schematic cross-sectional view showing one example of an optical element using a phase difference layer laminated body of the invention.
Figure 7:
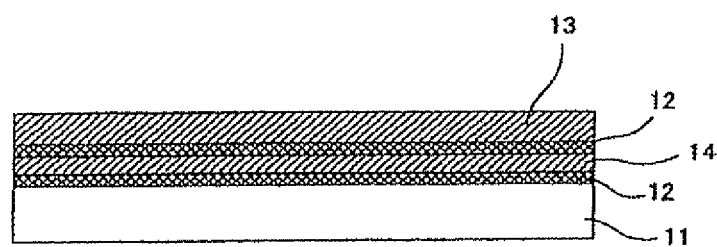
FIG. 7 is a schematic cross-sectional view showing another example of an optical element using a phase difference layer laminated body of the invention.

In this invention, also, as shown in FIG. 6 and FIG. 7, two or more phase difference layers can be laminated. In this case, preferably, the second phase difference layer is formed after the formation of an oriented film and rubbing treatment thereof on the first phase difference layer. The oriented film may be a photo-oriented film instead.

FIG. 6 shows an example in which a .lamda./2 phase difference layer 13 is formed on a glass substrate 11 with an oriented film 12 interposed therebetween, and a .lamda./4 phase difference layer 14 is further formed thereon with another oriented film 12 interposed therebetween. On the other hand, FIG. 7 shows an example in which a .lamda./4 phase difference layer 14 is formed on a glass substrate 11 with an oriented film interposed therebetween, and a .lamda./2 phase difference layer 13 is further formed thereon with another oriented film 12 interposed therebetween.

By projecting a linearly polarized beam to this phase difference layer laminated body from the side of the .lamda./2 phase difference layer 13 or a circularly polarized beam from the side of the .lamda./4 phase difference layer 14, the phase difference layer laminated body can function as a broadband phase difference plate shown, for example, in Japanese Patent Laid-Open Publication No. Hei 10-68816. Furthermore, by attaching a polarization plate on the opposite surface of the glass substrate 11 with an adhesive layer 15 interposed therebetween as shown in FIG. 6, it can function as a broadband circular polarization plate, with a non-polarized beam incident from the side of the polarization plate.

Note that, since the fast axes of the .lamda./2 phase difference layer 13 and .lamda./4 phase difference layer 14 need to be crossed approximately at 60.degree. (60.+−.10.degree.), the two oriented films should be inclined to each other approximately at 60.degree. (60.+−.10.degree.). This can be achieved by, for example, changing the direction of rubbing, or the like.

B. Method For Manufacturing a Phase Difference Layer Laminated Body

A method for manufacturing phase difference layer laminated body according to the invention is characterized by having:

a base material preparation step of preparing a base material;

an application step of applying a refractive index anisotropic material having an ability of providing refractive index anisotropy on the base material for forming a refractive index anisotropic material layer;

an orientation processing step of performing orientation processing to the refractive index anisotropic material layer; and an orientation fixing step of fixing the orientation of the refractive index anisotropic material layer that has undergone the orientation processing in the orientation processing step.

According to the method for manufacturing a phase difference layer laminated body of the invention, the orientation direction can be determined relatively freely in the orientation processing step, thus offering an advantage that phase difference layers of various different directions of fast axis (or slow axis) can be formed.

Figure 5:
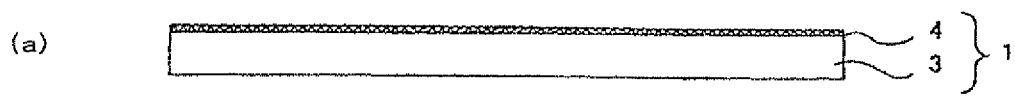
FIG. 5 is a diagram showing process steps of one example of a method for manufacturing a phase difference layer laminated body of the invention.
Figure 5:
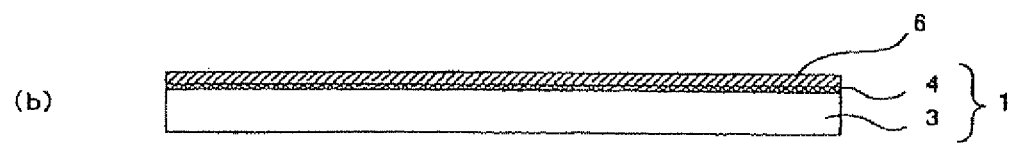
Figure 5:
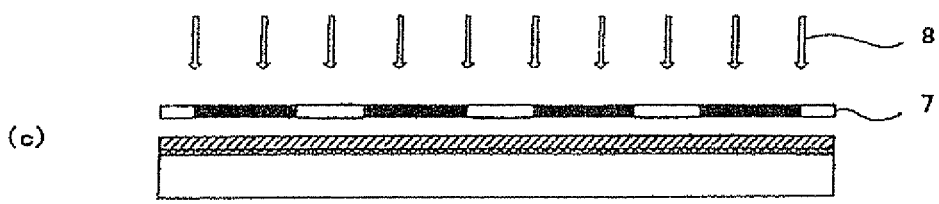
Figure 5:
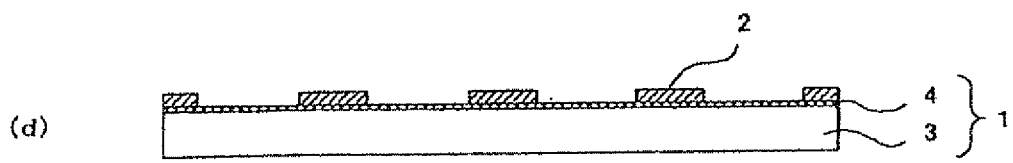

FIG. 5 shows one example of the method for manufacturing phase difference layers according to the invention. In this example, a base material 1 is first prepared, which includes a transparent substrate 3 on which is formed an oriented film 4, as shown in FIG. 5(a) (base material preparation step). Next, a refractive index anisotropic material layer 6 comprising a polymerizable liquid crystal material is formed on this base material 1 (application step). This is then let stand under a preset temperature for orienting the polymerizable liquid crystal material along the direction of orientation of the oriented film (orientation processing step). Next, with a photo mask 7 set thereon, an activating radiation beam 8 such as ultraviolet light or the like is irradiated, so that energy-radiated portions of the polymerizable liquid crystal material are cured in a certain pattern (as shown in FIG. 5(c), orientation fixing step), and lastly, it is developed using a solvent for forming the phase difference layer 2 in the certain pattern; a phase difference layer laminated body having a phase difference layer 2 in a pattern on a base material 1 is thus obtained.

The following is a more detailed description of each step of the manufacturing method of the phase difference layer laminated body according to the invention.

1. Base Material Preparation Step

The first step of the phase difference layer laminated body manufacturing method of the invention is the base material preparation step of preparing a base material.

In this invention, different types of base materials are used depending on the orienting method in the orientation processing step to be described later. That is, if the refractive index anisotropic material having an ability of providing refractive index anisotropy is a liquid crystal material and if the orienting method in the orientation processing step uses a base material having orientability, then it is necessary to prepare a base material having orientability. On the other hand, if another method is to be used for the orientation, then the base material need not have orientability.

Base materials having orientability will not be described here since they have already been described under the section "2. Base material having orientability" in "A. Phase difference layer laminated body" in the foregoing.

On the other hand, substrates in the case where no such orientability is required may suitably be selected in accordance with the purposes of use; since transparency is usually a requirement, a transparent and rigid material having no flexibility such as silica glass, Pyrex (registered trademark) glass, and synthetic silica glass, or a transparent and flexible material such as a transparent resin film, and optical resin sheet, or the like may be used, for example.

2. Application Step

The next step is the application step of applying a refractive index anisotropic material having an ability of providing refractive index anisotropy on the base material.

(Refractive Index Anisotropic Material)

The first example of the refractive index anisotropic material having an ability of providing refractive index anisotropy on the base material used in this invention is a liquid crystal material. The liquid crystal material is not described here since it has already been described under the section "1. Phase difference layer" in "A. Phase difference layer laminated body" in the foregoing.

For forming a refractive index anisotropic material layer using a polymerizable liquid crystal material, it is necessary to achieve polymerization using an activating radiation beam in the orientation fixing step to be described later. Depending on the type of the activating radiation beam, a photopolymerization initiator may be used as required, for instance in the case of UV curing. Specific examples of such a photopolymerization initiator are Irg 369, Irg 907, Irg 184 (trade name) and the like, manufactured by Ciba Specialty Chemicals Corp.

Refractive index anisotropic materials other than liquid crystal materials include materials that form layers and exhibit refractive index anisotropy when the molecules are more or less oriented in certain directions. Any materials that can usually be made to function as a phase difference layer by stretching may be used: Such materials include thermoplastic polymers such as polycarbonate polymers, polyester polymers such as polyarylate or polyethylene terephthalate, polyimide polymers, polysulfone polymers, polyethersulfone polymers, polystyrene polymers, polyolefin polymers such as polyethylene or polypropylene, polyvinyl alcohol polymers, cellulose acetate polymers, polyvinyl chloride polymers, and polymethylmethacrylate polymers.

In this invention, particularly, a refractive index anisotropic material that has relatively high polarity is preferable so that it can be oriented by applying a high electric or magnetic field in the orientation processing step to be described later for performing orientation processing. A specific example is a side-chain modified phenoxy resin into which 4-nitrophenyl carbamate is introduced.

(Application Method)

In the application step, for example, the above material is dissolved in a solvent or the like to form an application liquid, which is applied using various application methods such as spin coating, casting, dipping, bar coating, blade coating, roll coating, spray coating, and the like.

In the case of the application using a solvent, a drying step is necessary after the application for removing the solvent.

On the other hand, a refractive index anisotropic material that melts and liquefies at a temperature at which the material itself does not decompose or inflict damage on the base material, can be applied in a heated state without solvent. Same application methods as listed above can be used in this case, too.

In this invention, the more preferable method for the ease of handling is the method of dissolving the above-mentioned material in a solvent and applying the same. Because a polymerizable liquid crystal material is favorably used in this invention as noted above, it is particularly preferable to use a solution of this material as the application liquid.

Any solvents in which the above polymerizable liquid crystal material or the like can be dissolved, and which do not inhibit the orientability of the base material, may be used for this purpose.

Specific examples of solvents include hydrocarbons such as benzene, toluene, xylene, n-butylbenzene, diethylbenzene, and tetralin, ethers such as methoxybenzene, 1,2-dimethoxybenzene, and diethylene glycol dimethylether, ketones such as acetone, methylethylketone, methylisobutylketone, cyclohexanone, and 2,4-pentanedione, esters such as ethyl acetate, ethylene glycol monomethyl ether acetate, propylene glycol monomethyl ether acetate, propylene glycol monoethyl ether acetate, and .gamma.-butyrolactone, amide solvents such as 2-pyrrolidone, N-methyl-2-pyrrolidone, dimethyl formamide, and dimethylacetamide, halogenated solvents such as chloroform, dichloromethane, carbon tetrachloride, dichloroethane, tetrachloroethane, trichloroethylene, tetrachloroethylene, chlorobenzene, and ortho-dichlorobenzene, alcohols such as t-butylalcohol, diacetone alcohol, glycerin, monoacetin, ethylene glycol, triethylene glycol, hexylene glycol, ethylene glycol monomethyl ether, ethyl cellosolve, and butyl cellosolve the like, phenols such as phenol, and para-chlorophenol; these can be used either alone or in combination.

The solubility of the polymerizable liquid crystal material or the like may not be sufficient, or the above substrate having orientability may be corroded with the use of a single type of solvent. Such troubles can be avoided by using a mixture of two or more types of solvents. Among the above-listed solvents, hydrocarbon solvents and glycol mono ether acetate solvents are favorably used alone, while ethers and ketones are favorably used in mixture with glycols. There is no generic rule regarding the concentration of the solution because it should be determined depending on the solubility of liquid crystal compositions and the film thickness of phase difference layers to be fabricated; it is, however, usually within a range of 1 to 60% by weight, and more preferably 3 to 40% by weight In this invention, there may be cases where the phase difference layer should preferably be formed in a certain pattern on the substrate as described above. In such a case, a nozzle discharge technique such as an inkjet method or the like, or a printing technique such as photogravure or the like may be employed in this application step for patterned application. In the case where a highly precise pattern is needed, the base material may undergo a preparatory step of forming a pattern consisting of hydrophilic regions and water-repellent regions for giving wettability, the patterned application being made to the hydrophilic regions.

3. Orientation Processing Step

The next step, in this invention, is the orientation processing step of performing orientation processing to the refractive index anisotropic material layer applied on the base material. The orientation processing step according to the invention includes two methods: One method uses a base material having orientability, the other achieves orientation by applying force to molecules of the refractive index anisotropic material. Each method is respectively described below.

(Method Using a Base Material Having Orientability)

This method using a base material having orientability can be employed in the orientation processing step of the invention when the above-described liquid crystal material is used for the refractive index anisotropic material.

In the case of using a base material having orientability, the refractive index anisotropic material, or the liquid crystal material in this case, formed on the base material having orientability is heated to a temperature at which it can form a liquid crystal phase, the temperature being maintained the same until the liquid crystal material is oriented along directions defined by the base material.

The temperature and duration of time for which it is maintained depend largely on the liquid crystal material used and the orientability of the base material; they should suitably be set in accordance with the types of the liquid crystal material and base material having orientability.

Incidentally, a base material comprising a transparent substrate and an oriented film formed thereof to have orientability can be used with favorable results because of a wider range of selection of orientation direction or the direction of fast axis (or slow axis) of phase difference layer, and because the use of the oriented film makes possible to give a pattern to the orientation directions, as has been described under the section "2. Base material having orientability" in "A. Phase difference layer laminated body" in the foregoing.

(Orienting Method With Application of Force to Molecules)

In this invention, apart from the method using a base material having orientability, the refractive index anisotropic material having an ability of providing refractive index anisotropy can be oriented by a method of applying force to molecules.

In this orienting method of applying force to molecules, after heating the refractive index anisotropic material formed on the base material in the above application step to a temperature at least exceeding a temperature Tg at which molecules are movable inside the layer, force is applied to the molecules to orient them in certain directions.

Examples of such a force applying method include a method of applying a powerful electrostatic field, and a method of applying a powerful magnetic field, and the like.

While the above method using a base material having orientability can use only a liquid crystal material as the refractive index anisotropic material, this method can employ, not only liquid crystal materials, but also any material that has an ability of providing refractive index anisotropy.

If an electrostatic field is to be used, for example, for applying a force to the molecules, a refractive index anisotropic material having a molecular structure that can receive a force induced by an electrostatic field may be used; specifically, a material having polarity may be used. Similarly, if a magnetic field is to be used, a refractive index anisotropic material having a molecular structure that can receive a force induced by a magnetic field may be used; in this case also, a material having polarity may be used. The material, in this case, should have refractive index anisotropy as well as polarity, but it should not be limited to a polymer material; for example, a polymerizable monomer or oligomer may also be used. Any material can be used as long as it exhibits refractive index anisotropy by polymerization by, e.g., irradiation of an activating radiation beam in a state where the molecules are oriented by an electric or magnetic field.

According to this method, the orientation direction, i.e., the direction of fast axis (or slow axis) of phase difference layer, can readily be changed, e.g., by control of the position of an electromagnetic or magnetic field. Orientation is therefore possible in any direction, whereby the resultant phase difference layer laminated body has a merit that it can be used in a very wide range of applications.

4. Orientation Fixing Step

In this invention, an orientation fixing step is carried out for fixing the given orientation of the refractive index anisotropic material layer that has undergone the above orientation processing.

This orientation fixing step may be performed along with the orientation processing step, or after the orientation processing step has been completed. If, for example, the above orientation processing step employs a method using an electrostatic field, then the orientation fixing step, in which temperature is lowered in this case, may be performed while applying the electrostatic field.

In this invention, the orientation fixing step is carried out in different manners depending on the refractive index anisotropic material being used. Specifically, there are two cases; one is that the refractive index anisotropic material is a polymerizable material, and the other is that it is a non-polymerizable polymer material. Both cases, wherein the refractive index anisotropic material is a polymerizable material, and a non-polymerizable polymer material, are separately described below.

(Polymerizable Material)

In this invention, for the refractive index anisotropic material, polymerizable liquid crystal materials such as polymerizable monomers, polymerizable oligomers, and polymerizable liquid crystal polymers are preferably used as noted above.

In the orientation fixing step in which such a polymerizable liquid crystal material is used, an activating radiation beam, which promotes polymerization, is irradiated to the refractive index anisotropic material layer comprising the polymerizable liquid crystal material formed on the base material having orientability.

Activating radiation beam" mentioned in this invention means radiation rays that are capable of inducing polymerization in a polymerizable material, which may contain, if required, a polymerization initiator.

In this invention, a preferable method is that UV ray is used as the activating radiation beam for a polymerizable liquid crystal material, which contains a polymerization initiator that generates radicals for inducing radical polymerization upon irradiation of the UV rays. This is because the method using UV ray as the activating radiation beam is a well-established technique including the polymerization initiator used therewith, and can readily be applied to this invention.

This orientation fixing step with irradiation of an activating radiation beam may be performed at the same processing temperature as that in the above orientation processing step, i.e., the temperature at which the polymerizable liquid crystal material transforms into a liquid crystal phase, or lower than that. A temperature drop after the polymerizable liquid crystal material has transformed into a liquid crystal phase does not cause a disorder in the orientation.

Other polymerizable materials that have no liquid crystal properties may also be used for the polymerizable material as noted above; the orientation fixing step can be performed similarly in this case, too.

(Non-Polymerizable Polymer Material)

The refractive index anisotropic material having an ability of providing refractive index anisotropy can be a non-polymerizable polymer material when, for example, it is a liquid crystal material other than the above-mentioned polymerizable liquid crystal materials, i.e., one of commonly known non-polymerizable liquid crystal polymers.

The orientation fixing step in the case of using such a liquid crystal polymer is a step of lowering the temperature at which the polymer transforms into a liquid crystal phase to the temperature at which the polymer transforms into a solid phase. In the above orientation processing step, by the orientation processing, the liquid crystal polymer has transformed into a liquid crystal phase having a nematic structure along the orientation defined by the base material having orientability. In this state, by setting the temperature at which liquid crystal transforms to a glass state, the polymer can be made into a phase difference layer having, as a whole, refractive index anisotropy.

On the other hand, if the above orientation processing step employs an orienting method with application of force to molecules, fixing of the orientation of molecules can similarly be achieved by lowering the temperature in the oriented state. Thereby, a phase difference layer having, as a whole, refractive index anisotropy can be obtained. The temperature, in this case, should preferably be lowered to a level lower than the glass transition temperature Tg.

(Patterning of Phase Difference Layer)

In this invention, depending on the purposes of use, the phase difference layer formed on the base material may be required to have a certain pattern, as mentioned above. Patterning may be achieved in the above application step as described above, but in terms of pattern precision, it is preferable to perform the patterning in this orientation fixing step. That is, in the case of using the above-mentioned polymerizable material, patterning of the phase difference layer can readily be achieved by irradiation of the activating radiation beam in a pattern for forming polymerized portions in a pattern, followed by a development step using a solvent or the like.

Examples of solvents that can be used for the development include acetone, 3-methoxybutyl acetate, diglyme, cyclohexanone, tetrahydrofuran, toluene, methylene chloride, and methyl ethyl ketone or the like.

A favorable method of irradiating the material with the activating radiation beam in a pattern is a method using a photo mask as shown in FIG. 5, but it is not limited to this; a laser beam, for example, may be used as the activating radiation beam, the irradiation being performed as if to draw a line.

In this invention, if the development is performed using the solvent or the like thereafter, then it is preferable that the cured portions of the polymerizable liquid crystal material have cured to a degree of 85% by the above activating radiation beam. Thereby, deterioration of optical characteristics of the cured portions or swelling thereof during the development thereafter using a solvent are effectively prevented.

In the case of using a non-polymerizable material, on the other hand, patterning may be achieved by a photolithography technique using a photoresist.

5. Others

By the above orientation fixing step, a phase difference layer laminated body having a phase difference layer on the base material is obtained: In this invention, further, other functional layers such as a protective layer may be added according to needs.

Also, if the phase difference layer laminated body of the invention is a .lamda./4 phase difference layer, a further step may be included for bonding a polarization plate with an adhesive layer thereto. Thereby, circular polarization plates can be fabricated.

Furthermore, since the phase difference layer laminated body may have two or more laminated phase difference layers as shown in FIG. 6 and FIG. 7, the above application step, orientation processing step, and orientation fixing step may be repeated twice or more. If the orientation processing is achieved by the use of an oriented film as with the examples shown in FIG. 6 and FIG. 7, it is preferable to perform an oriented film formation step after the orientation fixing step.

C. Liquid Crystal Display Device

The liquid crystal display device of the invention is characterized by the use of a phase difference layer laminated body described in the section "A. Phase difference layer laminated body" above, and particularly, a preferable embodiment is a liquid crystal display device using a phase difference layer laminated body having the phase difference layer formed in a pattern on the base material.

As described above, the phase difference layer laminated body using a polymerizable liquid crystal material, particularly a polymerizable liquid crystal monomer, can readily be formed with a phase difference layer formed on the base material in a highly precise pattern, by patterned irradiation of an activating radiation beam using, e.g., a photo mask, in the orientation fixing step; a liquid crystal display device in which is incorporated such a phase difference layer laminated body having a phase difference layer in a highly precise pattern will have an unrivaled high quality.

One example of a liquid crystal display device is a three-dimensional liquid crystal display device shown, for example, in Japanese Patent Laid-Open Publication No. Hei 9-304740; the phase difference layer laminated body having a patterned phase difference layer on a base material may be used for the phase difference plates of this device that cover the entire liquid crystal display panel in a striped manner.

Another example is a projection type display device shown, for example, in U.S. Pat. No. 5,956,001 (Japanese Patent Laid-Open Publication No. Hei 8-234205); the phase difference layer laminated body having a patterned phase difference layer on a base material may be used for the .lamda./2 phase difference plates formed in a pattern in this projection type display device.

Figure 8:
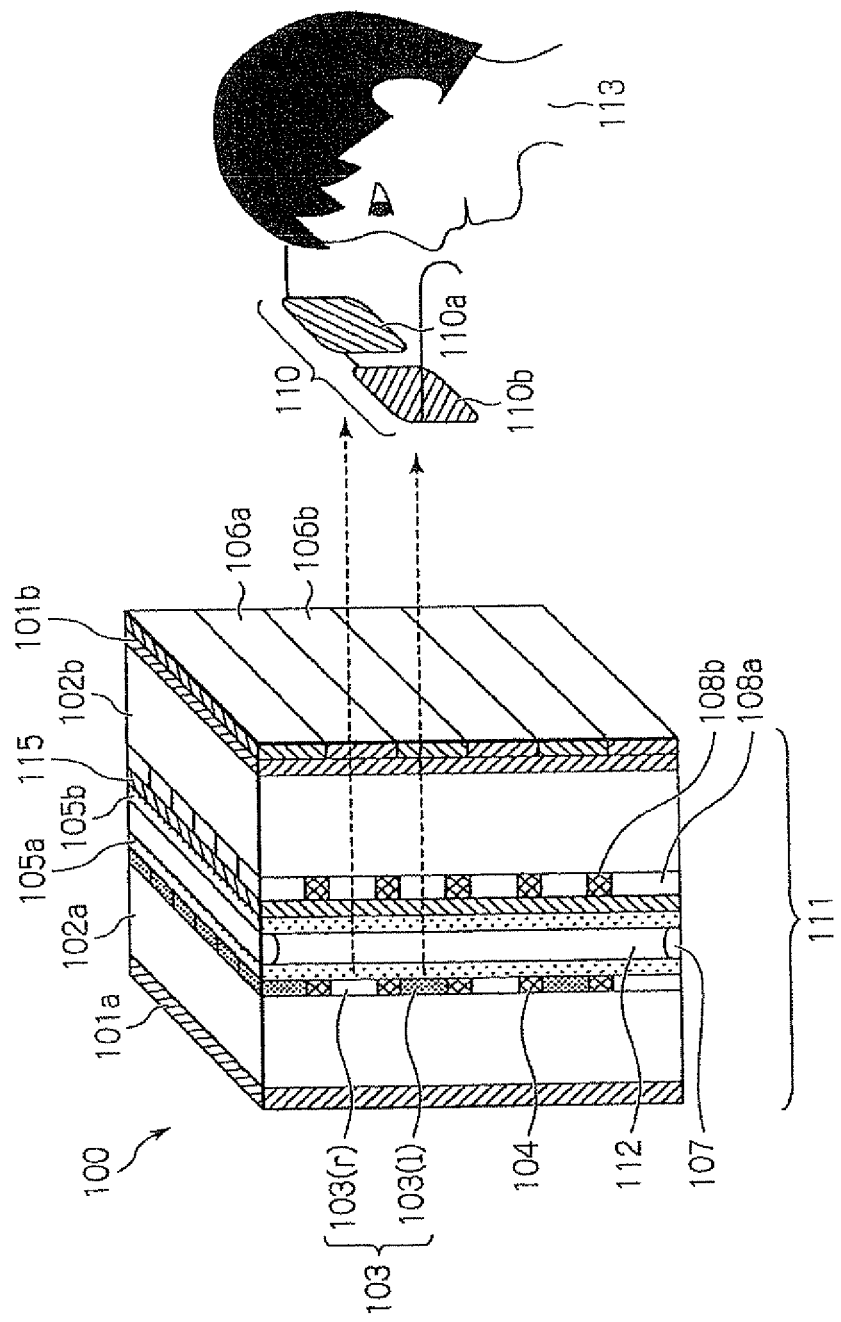
FIG. 8 is a perspective view of a liquid crystal display device having the phase difference layer laminated body of the invention and capable of displaying three-dimensional images, partially shown to a larger scale.

Referring now to FIG. 8, a configuration and a production method of a liquid crystal display panel 111 in a three-dimensional liquid crystal display device 100 will be described.

Scanning lines, signal lines, pixel electrodes (these not shown), and TFT elements 104 are formed on a glass substrate 102a. Pixel electrodes are provided one each for each of the pixels 103 arrayed in a matrix. The scanning lines are formed along a horizontal direction of the display screen of the liquid crystal display panel 111 such that each scanning line corresponds to one line of pixels 103, while the signal lines are formed orthogonally to the scanning lines, each signal line corresponding to one row of pixels 103. The scanning lines, signal lines, and pixel electrodes are connected to each other by the TFT elements 104.

The matrix-arrayed pixels 103 are divided into a right-eye pixel group 103 (r) and a left-eye pixel group 103 (l) for each line of pixels. The right-eye pixel group 103 (r) and left-eye pixel group 103 (l) are alternately arranged for each of the scanning lines.

Next, an oriented film 105a is formed on the entire surface of the glass substrate 102a provided with the TFT elements 104.

On a counter glass substrate 102b are formed a color filter 108a, and a black matrix 108b for shielding the TFT elements 104 formed on the glass substrate 102a from light.

In this embodiment, the color filter 108a was formed such that the filter portions of respective colors R, G, and B forming the color filter 108a are arranged in stripes parallel to the signal lines, and such that R, G, and B are arranged in a cyclic pattern in the scanning line direction (horizontal direction in the screen). The black matrix 108b was formed in a lattice pattern so that each pixel is surrounded. A transparent conductive film such as ITO used as transparent electrodes 115 is formed on the entire surface of the substrate 102b over the color filter 108a by sputtering, and further, an oriented film 105b is formed thereon similarly to the oriented film 105a. The counter substrate is thus formed.

Successively, the substrate on the TFT side and counter substrate prepared as described above respectively undergo a rubbing process, after which both substrates are bonded together with a spacer 107 to keep a constant distance between them. Next, liquid crystal is injected in a vacuum in between the substrates to form a liquid crystal layer 112. The liquid crystal display panel 111 is completed through the above process steps. In this embodiment, the display mode of the liquid crystal display panel 111 is a TN display mode.

Here, a polarization plate 101b having the same polarization axis over the entire surface is provided so as to adjoin the glass substrate 102b of the liquid crystal display panel 111 in the liquid crystal display device 100. Successively, phase difference layer laminated bodies 106a and 106b are provided alternately in stripes on the polarization plate 101b for each of the scanning lines. That is, the phase difference layer laminated bodies 106a and 106b are arranged alternately for each line of pixels such that they each have a width corresponding to one line of pixels aligned along the horizontal direction. Accordingly, a sum of a number of the stripe phase difference layer laminated bodies 106a and 106 equal to a number of TV scanning lines. The slow axis of the phase difference layer laminated body 106a is oriented at 45° to the polarization axis of the polarization plate 101b, while the slow axis of the phase difference layer laminated body 106b is oriented at 45° in the opposite direction of the slow axis of the phase difference layer laminated body 106a to the polarization axis of the polarization plate 101b.

The pixels 103 arrayed in a matrix and the phase difference layer laminated body 106a, 106b are formed in an equal pitch in the direction orthogonally to the scanning line.

In this embodiment, the phase difference layer laminated bodies 106a and 106b are both quarter wave plates. Therefore, the light that passes through the polarization plate 101b and the phase difference layer laminated bodies 106a and 106b after being emitted from the liquid crystal display panel 111 is circularly polarized light wherein the polarization directions are at right angles to one another alternately pixel row by pixel row. A viewer 113 can view a three-dimensional image even when he/she tilts his/her head by wearing circular polarization glasses 110 having polarization plates 110a and 110b corresponding to respective circular polarization directions.

Next, referring to FIG. 9, a method of patterning a photo-oriented film in the phase difference layer laminated bodies provided alternately in stripes for each scanning line in the above-described liquid crystal display panel 111 will be described.

Such phase difference layer laminated bodies are patterned by exposure through a mask using a photo-oriented film that is oriented by light.

Figure 9:
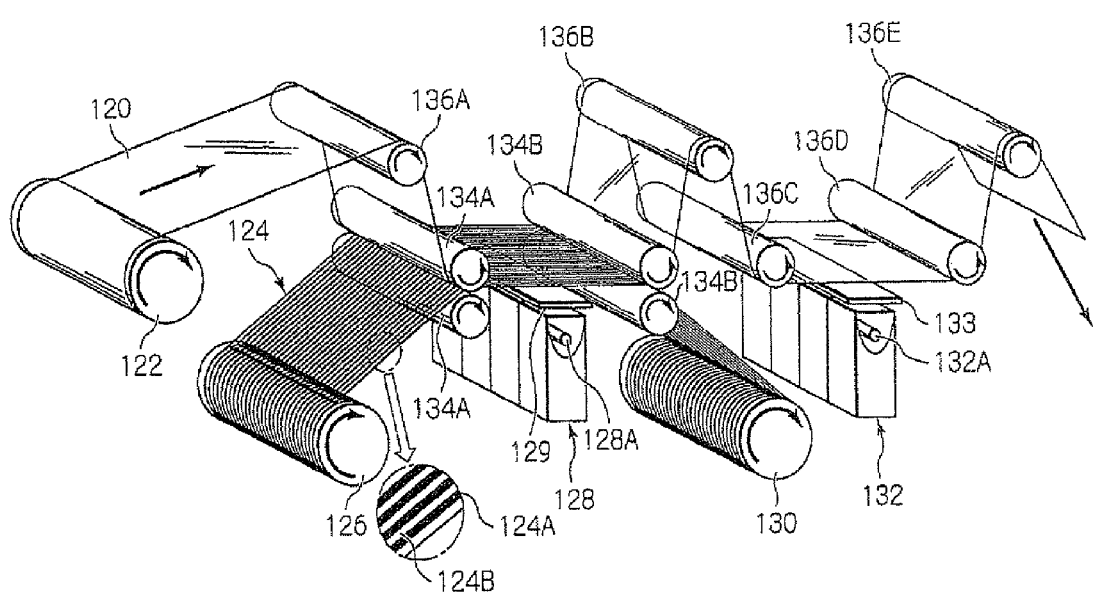
FIG. 9 is a perspective view showing a patterning process of a photo-oriented film.

FIG. 9 illustrates a production method wherein the stripe pattern such as the one mentioned above is formed continuously on the photo-oriented film.

Reference numeral 122 in FIG. 9 denotes a roll of an oriented film, 124 a photo mask, and 126 a roll of a photo mask, respectively.

Reference numeral 128 denotes a patterning/exposure part having an elongated light source 128A for patterning the photo-oriented film by exposure. Reference numeral 130 denotes a photo mask take-up roll for taking up the photo mask 124 after it has passed through the patterning/exposure part 128. Reference numeral 132 denotes a solid exposure part having an elongated light source 132A for exposing the oriented film 120 after it has passed through the patterning/exposure part 128. Reference numerals 134A and 134B denote nip rolls, and 136A to 136E guide rolls, respectively.

Here, the photo-oriented film has photosensitivity at a wavelength in the UV light region, and the photo mask 124 includes a UV light transmissive film formed with a patterned light shielding film.

The photo mask 124 has the patterned light shielding film formed correspondingly to one of the above-described stripe phase difference layer laminated bodies 106a and 106b such that light-shielding portions having a width corresponding to one line of pixels and light-transmitting portions having a width corresponding to one line of pixels are formed alternately and linearly such as to adjoin each other, continuously in the lengthwise direction of the film. Here, a sum of a number of the light-shielding portions correspondingly to one of the stripe phase difference layer laminated bodies 106a and 106b and a number of the non-light shielding portions equals to a number of TV scanning lines.

Next, the process step of continuously exposing the photo-oriented film 120 will be explained.

The oriented film 120 and the photo mask 124 are respectively drawn out from the roll 122 of the oriented film and the roll 126 of the photo mask, passed through between the nip rolls 134A and 134B so as to move them continuously in a horizontal orientation in an overlapped manner.

Here, the photo mask 124 is overlapped on the underside of the oriented film 120, and UV rays of the photosensitive wavelength of the photo-oriented film are irradiated from below by the patterning/exposure part 128. In this step, exposed parts of the photo-oriented film are exposed 100% to the UV rays from the patterning/exposure part 128 so that there is left no unexposed portions therein.

Next, the photo mask 124 exiting from between the nip rolls 134B is taken up on the photo mask take-up roll 130 positioned diagonally below the nip rolls 134B. The oriented film 120, on the other hand, after passing through the nip rolls 134B, is wound on the guide roll 136B thereabove, thereby being separated from the photo mask 124.

Next, when the film passes under the pair of horizontal guide rolls 136C and 136D, UV rays of the photosensitive wavelength of the photo-oriented film are irradiated from the solid exposure part 132, so that non-exposed portions corresponding to the light-shielding portions of the photo mask 124 are exposed.

Here, the patterning/exposure part 128 and the solid exposure part 132 include a linear polarization plate 129 and 133 having polarization axes oriented at 90° to each other, respectively, so that stripe portions exposed at the patterning/exposure part 128 and stripe portions exposed at the solid exposure part 132 in the photo-oriented film have orientation directions that are oriented at 90° to each other.

After being exposed at the solid exposure part 132, the oriented film 120 is fed, via the guide rolls 136D and 136E, to a process step of applying crystal liquid material.

Figure 10:
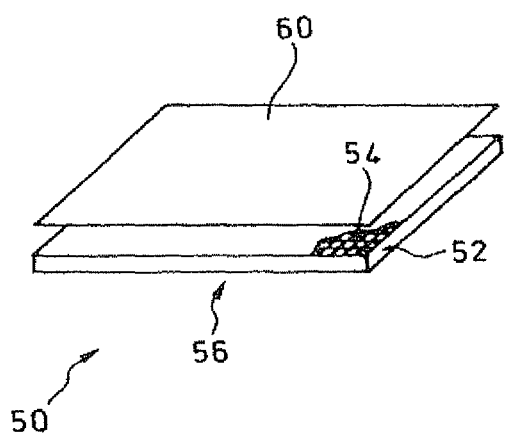
FIG. 10 is an exploded perspective view showing the schematic construction of a liquid crystal display device according to one embodiment of the invention.
Figure 11:
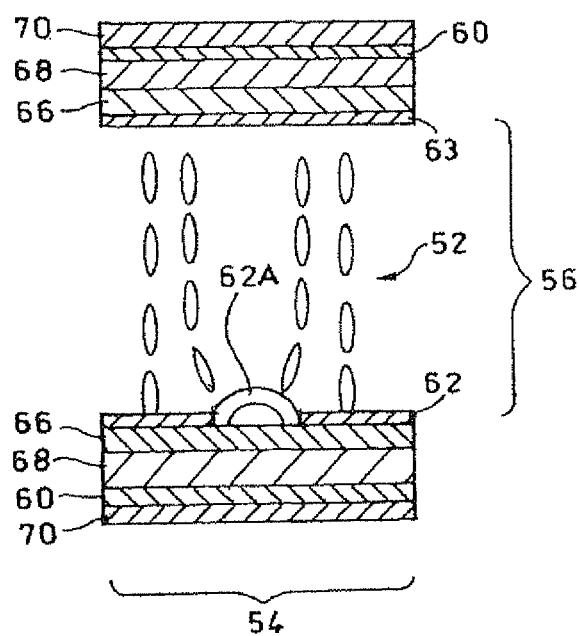
FIG. 11 is an enlarged side cross-sectional view showing the essential construction of the liquid crystal display device.

Yet another preferred embodiment is a liquid crystal display device 50 shown in FIG. 10 to FIG. 11, including the following: A liquid crystal display element 56 including a liquid crystal layer 52 and a plurality of unit cells 54 that constitute a multiplicity of pixels, liquid crystal molecules on the surface of the liquid crystal layer 52 being oriented with a plurality of different directors in directions indicated by arrows in FIG. 12 in each of the unit cells 54; and phase difference layers (phase difference optical elements) 60 arranged on both sides in the thickness direction of the liquid crystal display element 56, the phase difference layers divided into a plurality of (four in this embodiment) oriented compensation regions 58A, 58B, 58C, 58D in accordance with the directions of the liquid crystal directors in each unit cell 54, the liquid crystal substance being oriented and fixed in each of the oriented compensation regions 58A, 58B, 58C, 58D.

The liquid crystal display element 56 is an MVA type; it has the liquid crystal layer 52 sealed between a pair of oriented films 62, 63, as shown in FIG. 11. Reference numerals 66, 68, and 70 denote transparent electrodes, transparent base material, and polarization plates, respectively.

Figure 12:
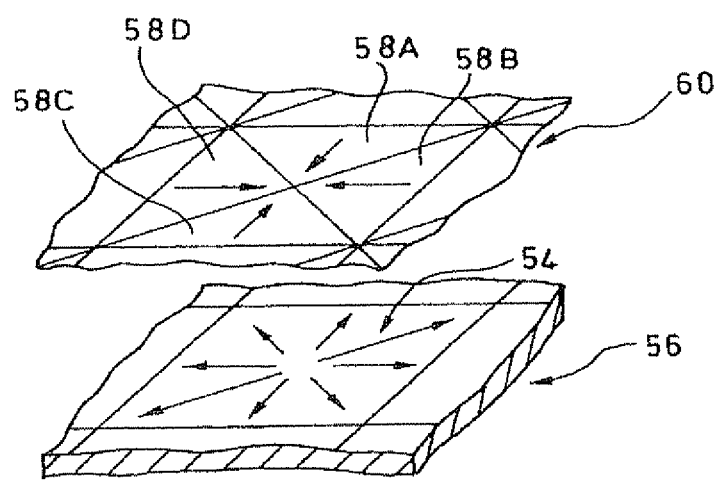
FIG. 12 is a perspective view showing oriented compensation regions in the liquid crystal display device.

Further, as shown in FIG. 12, the liquid crystal molecules on the surface of the liquid crystal layer 52 are oriented with the directors in symmetric directions relative to the center of each unit cell 54. Specifically, one of the oriented films 62 is formed with a semi-spherical rib 62A protruded at the center of each cell 54, as shown in FIG. 11, and the liquid crystal molecules on the surface of the liquid crystal layer 52 are oriented at angles radiating from the rib 62A.

Each unit cell 54 has four oriented compensation regions 58A, 58B, 58C, 58D that are defined by dividing the unit cell 54 into a plurality of (four in this embodiment) sections with an equal angular spacing around the center, and the liquid crystal substance divided into these oriented compensation regions 58A, 58B, 58C, 58D is oriented and fixed.

By thus orienting the molecules in the phase difference layer 60 for each of the oriented compensation regions 58A, 58B, 58C, 58D in accordance with the directions of the liquid crystal directors of the liquid crystal layer 52, optical compensation is made possible in more precise and various ways than conventionally practiced, whereby the problem of viewing-angle dependency is much improved and high-quality image display is realized.

Divisional orientation and fixation of the liquid crystal substance to form the oriented compensation regions may be achieved either by coating a liquid crystal substance having nematic properties on the substrate and orienting it in a certain direction using an electrostatic or magnetic field, followed by a fixing step of irradiating UV rays or the like using a photo mask, these steps being repeated for each of the oriented compensation regions; or, by coating the liquid crystal substance on an oriented film that has been processed to have different orientation directions for each of the oriented compensation regions by a mask rubbing technique, followed by fixing of the liquid crystal in the oriented state.

Figure 13:
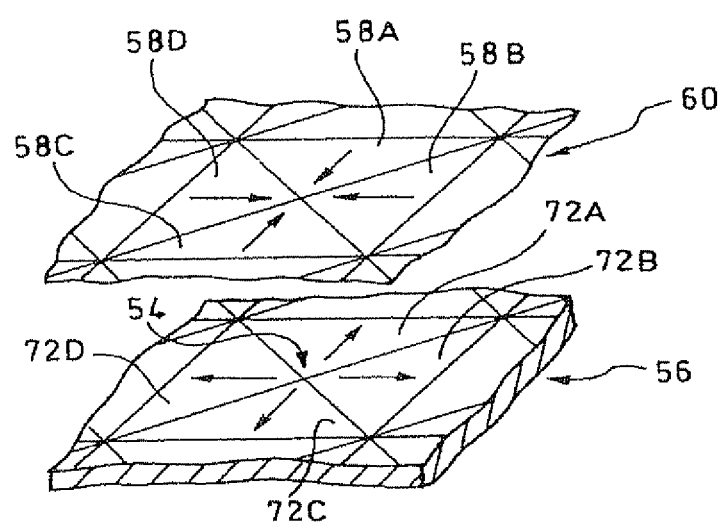
FIG. 13 is a perspective view showing oriented display regions and oriented compensation regions in the liquid crystal display device.

In this embodiment, the liquid crystal molecules on the surface of the liquid crystal layer 52 are oriented with the directors in symmetric directions relative to the center of each unit cell 54, but, as shown in FIG. 13, one alternative is to divide each unit cell 54 of the liquid crystal display element 56 into a plurality of (four in this embodiment) oriented display regions 72A, 72B, 72C, 72D, the liquid crystal molecules on the surface of the liquid crystal layer 52 being oriented in respective directions of the oriented display regions 72A, 72B, 72C, 72D, and to form the oriented compensation regions 58A, 58B, 58C, 58D correspondingly to the oriented display regions 72A, 72B, 72C, 72D.

Orientation processing of the oriented film to form the oriented display regions 72A, 72B, 72C, 72D with different orientation directions may be achieved by the use of a square pyramid rib, or by a known photo-oriented film method or the like.

By thus orienting the molecules in the phase difference layer for each of the oriented compensation regions in accordance with the orientation of liquid crystal molecules of each of the oriented display regions, even more precise optical compensation can be realized.

In the above embodiment, each unit cell 54 of the liquid crystal display element 56 is divided into four oriented display regions, but the invention is not limited to this; for example, a triangular prism or pyramid rib may be formed on the oriented film to divide each unit cell of the liquid crystal display element into two or three oriented display regions, or, a polygonal pyramid rib of more than five base sides may be formed on the oriented film to divide each unit cell of the liquid crystal display element into five or more oriented display regions. It goes without saying that the effect of improving display quality is also obtained in these cases.

Incidentally, the semi-spherical rib 62A mentioned above divides each unit cell of the liquid crystal display element into an infinite number, as it were, of oriented display regions.

Similarly, each unit cell of the phase difference layer may be divided into two or three oriented compensation regions, or it may be divided into five or more oriented compensation regions.

In the above embodiment, the phase difference layer 60 has four oriented compensation regions 58A, 58B, 58C, 58D corresponding to the four oriented display regions 72A, 72B, 72C, 72D of the unit cell 54 of the liquid crystal display element 56, but the invention is not limited to this; a plurality of oriented compensation regions of optical compensation elements may be provided relative to one oriented display region in the unit cell. Thereby, even more precise and variant optical compensation can be realized.

Also, although the phase difference layers 60 are arranged on both sides in the thickness direction of the liquid crystal display element 56 in the above embodiment, the invention is not limited to this; the phase difference layer may be arranged only on one side in the thickness direction of the liquid crystal display element, depending on the manner in which optical compensation is carried out.

Also, although the liquid crystal display element 56 is an MVA type in the above embodiment, the invention is not limited to this; the invention can obviously be applied to other types of liquid crystal display elements including other VA types such as a PVA type, and TN type, STN type, IPS type, OCB type, and ECB type or the like.

Furthermore, the invention should not be limited to the above-described embodiments, which were given only by way of example; the technical scope of the invention includes any other constructions substantially identical to and having similar effects as those of the technical ideas defined by the claim of the invention.

For example, while the material used for the phase difference layer has been described as a liquid crystal material that can form a nematic phase under the section "A. Phase difference layer laminated body" above, any liquid crystal material that does not form a cholesteric phase can be used without any problems in this invention; thus a liquid crystal material that forms a smectic phase should also be included in the definition of liquid crystal in this invention.

EXAMPLE

An example will be described below for further explanation of the invention.

A solution of polymerizable liquid crystal monomer in toluene was prepared, the monomer having a mesogen in the center, polymerizable acrylate at either end, and a spacer linking therebetween, and having a liquid crystal-isotropic transition temperature (temperature at which liquid crystal transforms into an isotropic phase) of 100.degree. C. Note that, a photopolymerization initiator (Irg 184: Ciba Specialty Chemicals Corp.) was added to the above solution in toluene in an amount of 5% by weight relative to the monomer molecules.

Meanwhile, polyimide was applied on a glass substrate to form a coat, which then underwent rubbing treatment in certain directions, to form an oriented film.

This glass substrate with the oriented film was then set in a spin coater, and the above solution in toluene was applied onto the oriented film to a thickness of about 5 .mu.m by spin coating.

Next, the substrate was heated at 80.degree. C. for one minute to vaporize toluene in the solution, after which it was confirmed that the liquid crystal film (uncured liquid crystal film) formed on the oriented film was in a nematic phase.

UV rays were then irradiated at 100 mJ/cm.sup.2 to the uncured nematic liquid crystal film by a UV irradiation apparatus, with the use of a photo mask having openings in a certain pattern. The UV irradiation intensity was set so that UV-irradiated portions of the nematic liquid crystal film would polymerize (cure) to a degree of 90% or more.

Thereafter, the glass substrate with the oriented film formed with the nematic liquid crystal film was immersed in acetone with rocking motion applied thereto for one minute so as to remove uncured portions of the nematic liquid crystal film.

Finally, the above glass substrate was taken out from acetone and dried; a phase difference layer laminated body having a phase difference layer with a desired pattern was thus fabricated, the nematic liquid crystal film being formed in UV-irradiated portions, while the oriented film being exposed in other portions.

Incidentally, the nematic liquid crystal film formed in this example had a substantially uniform film thickness of 1.5 .mu.m, and the pattern was formed with a very high degree of precision.

INDUSTRIAL APPLICABILITY

According to the present invention, a liquid crystal material that can form a nematic phase is used for forming a phase difference layer in a pattern, and orientation directions are readily determined by selecting the type of liquid crystal materials and base materials having orientability; thus the invention provides a phase difference layer laminated body that can be applied to a three dimensional liquid crystal display device.

What is claimed:

1. A method of manufacturing an oriented film, comprising:
   a patterning exposure step of exposing a surface of a photo-oriented film through a photo mask to linearly polarized light, the photo-oriented film is formed by being applied on an oriented film, the photo mask comprising a light transmitting film formed with a light-shielding pattern comprising light shielding portions and non-light shielding portions, the light transmitting film transmitting light of a photosensitive wavelength of the photo-oriented film;
   a second exposure step of exposing portions of the patterned photo-oriented film that were not exposed in the previous patterning exposure step to second linear polarization light having a polarization axis oriented at 90° to a polarization axis of the linear polarization light used in the previous step;
   a step of overlapping the photo mask on the oriented film before the patterning exposure step; and
   a step of separating the photo mask from the photo-oriented film after the patterning exposure step;

wherein:
the light-shielding pattern of the photo mask is formed with light shielding portions and non-light shielding portions alternately and in parallel with an equal width, so that, in the second exposure step, parallel linear exposed portions that correspond to the non-light shielding portions are patterned on the photo-oriented film;
the oriented film and the photo mask are both formed in a belt-like shape having the same width, the light shielding pattern comprising stripes arranged in parallel in a widthwise direction continuously in a lengthwise direction of the photo mask; and wherein in the patterning exposure step, the oriented film and the photo mask are overlapped upon one another as they are moved at a constant rate in the same direction so that the photo-oriented film is exposed to light for patterning, and in the separating step, the photo mask is taken up as the oriented film and the photo mask are moved at a constant rate so as to separate the photo mask from the oriented film.

2. The method of manufacturing an oriented film according to claim 1, wherein:
the light shielding portions and the non-light shielding portions therebetween in the light shielding pattern have the same width, and
a sum of a number of stripe light shielding portions and a number of the non-light shielding portions equals a number of TV scanning lines.

\* \* \* \* \*